US012812851B2

(12) United States Patent
Choi et al.

(10) Patent No.: US 12,812,851 B2
(45) Date of Patent: Nov. 24, 2026

(54) SEMICONDUCTOR DEVICE WITH CONDUCTIVE SUPPORTS ELECTRICALLY CONNECTED TO CONTACT PLUGS VIA GATE LINES AND METHOD OF MANUFACTURING SEMICONDUCTOR DEVICE THEREOF

(71) Applicant: SK hynix Inc., Gyeonggi-do (KR)

(72) Inventors: Won Geun Choi, Gyeonggi-do (KR); Rho Gyu Kwak, Gyeonggi-do (KR); Na Yeong Yang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 341 days.

(21) Appl. No.: 18/602,055

(22) Filed: Mar. 12, 2024

(65) Prior Publication Data

US 2025/0185240 A1 Jun. 5, 2025

(30) Foreign Application Priority Data

Dec. 4, 2023 (KR) ........................ 10-2023-0173782

(51) Int. Cl.

| | |
|---|---|
| ***H10B 41/27*** | (2023.01) |
| ***H10B 41/10*** | (2023.01) |
| ***H10B 43/10*** | (2023.01) |
| ***H10B 43/27*** | (2023.01) |
| ***H10B 63/00*** | (2023.01) |

(52) U.S. Cl.
CPC ............. *H10B 41/27* (2023.02); *H10B 41/10* (2023.02); *H10B 43/10* (2023.02); *H10B 43/27* (2023.02); *H10B 63/845* (2023.02)

(58) Field of Classification Search
CPC ........ H10B 41/27; H10B 41/10; H10B 43/10; H10B 43/27; H10B 63/845; H10B 41/30; H10B 41/20; H10B 43/20; H10B 43/30; H10B 63/30; H10B 43/40; H10B 43/50; H10B 41/40; H10B 41/50
See application file for complete search history.

(56) References Cited

U.S. PATENT DOCUMENTS

| | | | | |
|---|---|---|---|---|
| 11,444,097 | B2 | 9/2022 | Takeshita et al. | |
| 2018/0337192 | A1* | 11/2018 | Kim | H10B 41/27 |
| 2019/0088672 | A1* | 3/2019 | Tomimatsu | G11C 16/0483 |
| 2024/0349503 | A1* | 10/2024 | Choi | H10B 43/10 |
| 2025/0006662 | A1* | 1/2025 | Han | H10B 43/10 |
| 2025/0040138 | A1* | 1/2025 | Heo | H10B 41/27 |

FOREIGN PATENT DOCUMENTS

KR 10-2023-0033486 A 3/2023

* cited by examiner

*Primary Examiner* — John P. Dulka
(74) *Attorney, Agent, or Firm* — IP&T GROUP LLP

(57) ABSTRACT

A semiconductor device may include a gate structure including stacked gate lines, conductive supports extending perpendicularly or substantially perpendicularly through the gate structure, and contact plugs extending perpendicularly or substantially perpendicularly only partially inside the gate structure, each contact plug being positioned between adjacent conductive supports and respectively connected to the gate lines. A first contact plug among the contact plugs may be electrically connected to a first gate line among the gate lines, and the first contact plug may be electrically connected to a first conductive support among the conductive supports through the first gate line.

19 Claims, 21 Drawing Sheets

H-H'

D-D'

A-A'

SEMICONDUCTOR DEVICE WITH CONDUCTIVE SUPPORTS ELECTRICALLY CONNECTED TO CONTACT PLUGS VIA GATE LINES AND METHOD OF MANUFACTURING SEMICONDUCTOR DEVICE THEREOF

CROSS-REFERENCE TO RELATED APPLICATION

This application claims priority under 35 U.S.C. § 119 to Korean Patent Application No. 10-2023-0173782 filed on Dec. 4, 2023, which is incorporated herein by reference in its entirety.

BACKGROUND

1. Technical Field

Embodiments of the present disclosure relate generally to an electronic device, and more particularly, to a semiconductor device and a method of manufacturing the semiconductor device.

2. Related Art

An integration degree of a semiconductor device is mainly determined by the area occupied by the unit memory cell. Recently, as improvements in the integration degree of a two-dimensional semiconductor device in which a memory cell is formed as a single layer on a substrate have reached a plateau with little or no significant further improvements, a three-dimensional semiconductor device in which memory cells are stacked in multiple layers over a substrate has been proposed. In addition, at the present time significant efforts are focusing in developing more stable three-dimensional structures with improved operational reliability and functionalities as well as improved manufacturing methods.

SUMMARY

According to an embodiment of the present disclosure, a semiconductor device may include a gate structure including stacked gate lines and insulation layers alternately stacked over a substrate, conductive supports extending perpendicularly or substantially perpendicularly through the gate structure, and contact plugs extending perpendicularly or substantially perpendicularly only partially inside the gate structure, each contact plug being positioned between adjacent conductive supports, and extending to a different depth within the gate structure to connect to a different one of the stacked gate lines. A first contact plug among the contact plugs may be electrically connected to a first gate line among the gate lines, and the first contact plug may be electrically connected to a first conductive support among the conductive supports through the first gate line.

According to an embodiment of the present disclosure, a semiconductor device may include a peripheral circuit, a gate structure positioned on the peripheral circuit and including stacked gate lines, a contact plug extending through the gate structure and electrically connected to a first gate line among the gate lines, a conductive support extending through the gate structure and electrically connected to the peripheral circuit, insulating barriers entirely surrounding a sidewall of the conductive support to insulate the conductive support from remaining gate lines other than the first gate line among the gate lines, and a dummy insulating barrier partially surrounding the sidewall of the conductive support so that the conductive support and the first gate line are electrically connected.

According to an embodiment of the present disclosure, a method of manufacturing a semiconductor device may include forming a stack including first material layers and second material layers alternately stacked, forming a conductive support extending through the stack, forming a first opening extending through the stack, forming a second opening exposing the conductive support by etching the first material layer exposed through a lower surface of the first opening, forming a sacrificial pattern in the second opening, forming a contact plug in the first opening, removing the sacrificial pattern to expose the conductive support and the contact plug, and forming a conductive layer electrically connecting the conductive support and the contact plug.

According to an embodiment of the present disclosure, a method of manufacturing a semiconductor device may include forming a stack including first material layers and second material layers alternately stacked, forming a hole extending through the stack, forming insulating barriers on a sidewall of the first material layers exposed through the hole, forming a conductive support in the hole, forming a first opening extending through the stack, etching the first material layer exposed through a lower surface of the first opening to expose an insulating barrier, forming a second opening exposing the conductive support, by etching the insulating barrier, forming a contact plug in the first opening, forming third openings by removing the first material layers, and forming gate lines in the second opening and the third openings.

DETAILED DESCRIPTION

An embodiment of the present disclosure provides a semiconductor device and a method of manufacturing the semiconductor device having a stable structure and an improved characteristic.

An integration degree of a semiconductor device may be improved by stacking memory cells in three dimensions. In addition, a semiconductor device with a stable structure and improved reliability may be provided.

Hereinafter, embodiments according to the technical spirit of the present disclosure are described with reference to the accompanying drawings.

Figure 1A:
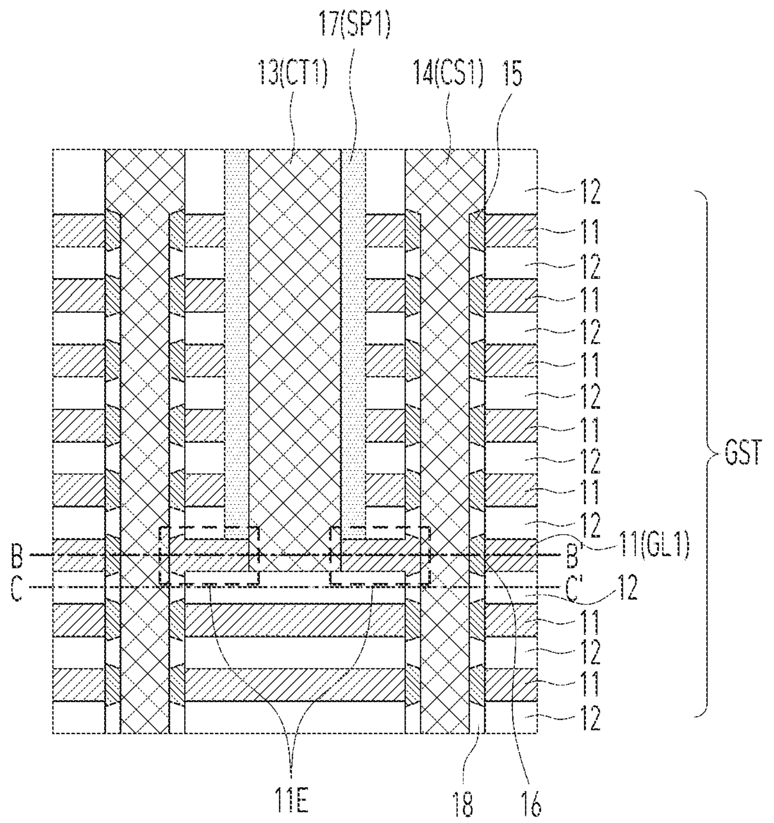
FIGS. 1A to 1D are diagrams illustrating a structure of a semiconductor device according to an embodiment of the present disclosure.
Figure 1B:
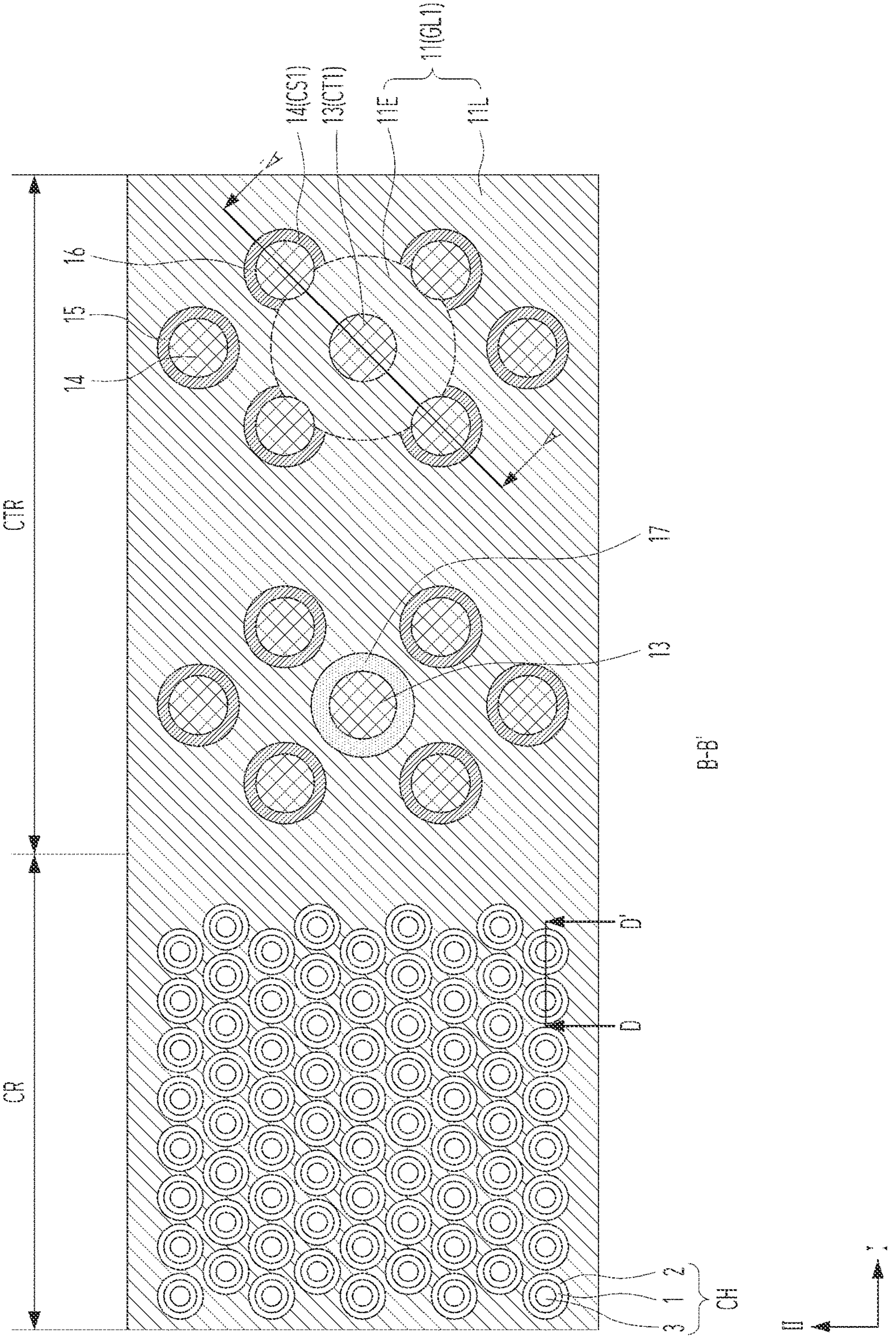
Figure 1C:
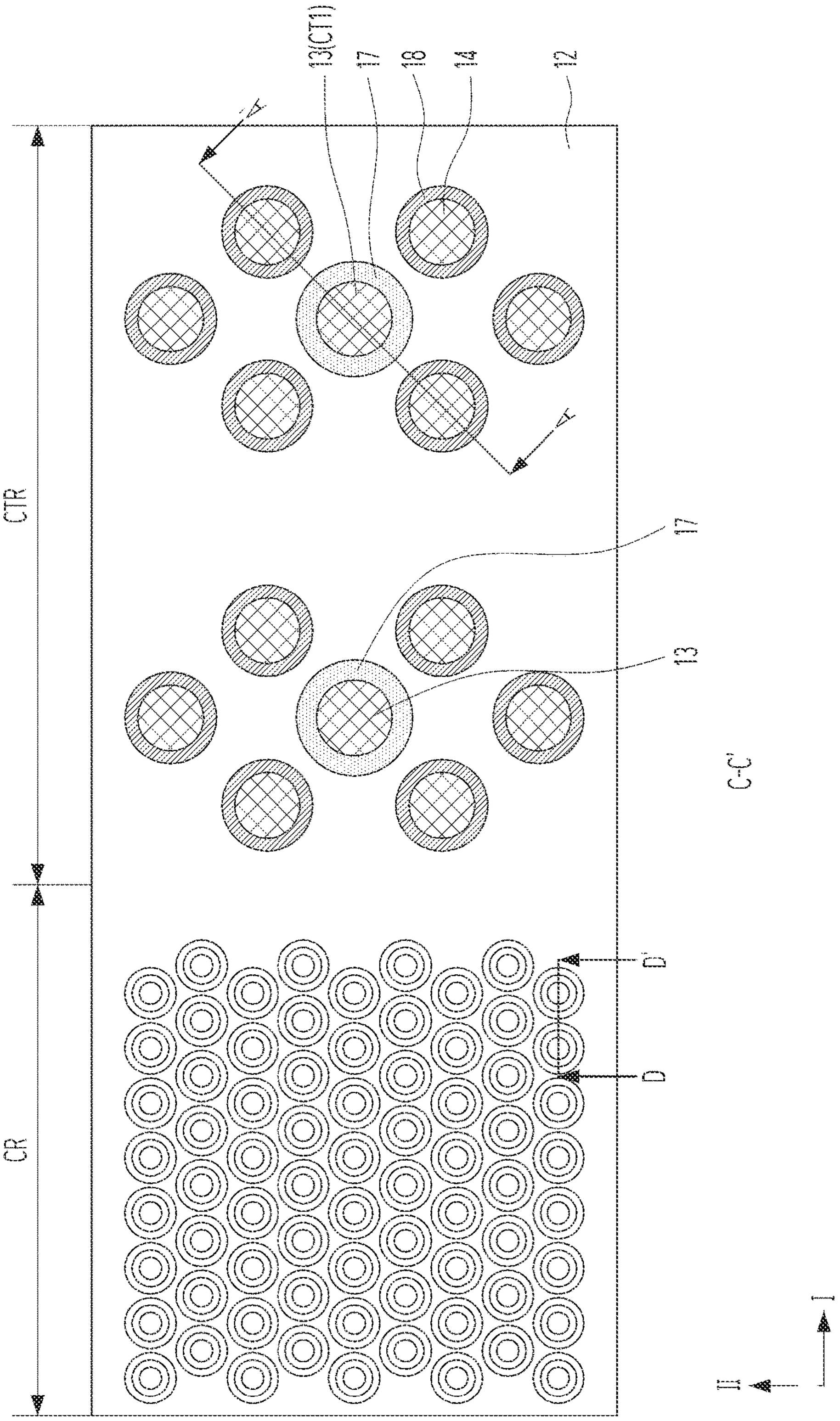
Figure 1D:
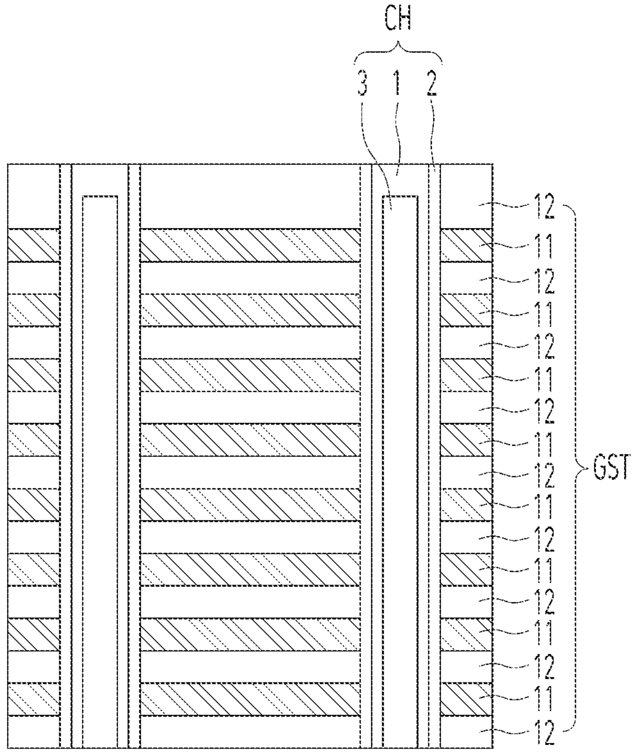

FIGS. 1A to 1D are diagrams illustrating a structure of a semiconductor device according to an embodiment of the present disclosure. FIG. 1A is a cross-sectional view taken along A-A' of FIGS. 1B and 1C, FIG. 1B is a plan view taken along B-B' of FIG. 1A, FIG. 1C is a plan view taken along C-C' of FIG. 1A, and FIG. 1D is a cross-sectional view taken along D-D' of FIGS. 1B and 1C.

Referring to FIGS. 1A to 1D, the semiconductor device may include a gate structure GST, contact plugs 13, and conductive supports 14. The semiconductor device may further include at least one of insulating barriers 15, dummy insulating barriers 16, insulating spacers 17, insulating liners 18, and a channel structure CH.

The gate structure GST may include stacked gate lines 11. In an embodiment, the gate structure GST may include gate lines 11 and insulating layers 12 that are alternately stacked. The gate lines 11 may be a source select line, a drain select line, or a word line. The gate lines 11 may include a conductive material such as polysilicon, tungsten (W), or molybdenum (Mo). The insulating layers 12 may be for insulating the stacked gate lines 11 from each other and may include oxide, nitride, an air gap, or the like.

The gate structure GST may include a cell region CR and a contact region CTR. The cell region CR may be a region where memory cells are stacked. The contact region CTR may be a region where an interconnect structure for transferring a driving bias to the stacked memory cells is positioned. The interconnect structure may include a contact plug, a line, and the like.

The channel structure CH may extend through the cell region CR of the gate structure GST. The channel structure CH may include a channel layer 1 and may further include at least one of a memory layer 2 and an insulating core 3. The memory layer 2 may include at least one of a tunneling layer, a data storage layer, and a blocking layer. The data storage layer may include a floating gate, polysilicon, a charge trap material, nitride, a variable resistance material, and the like. A memory cell, a source select transistor, or a drain select transistor may be positioned in a region where the channel structure CH and the gate lines 11 intersect.

The contact plugs 13 may extend inside the gate structure GST in the contact region CTR of the gate structure GST. The contact plugs 13 may extend in different depths inside the gate structure GST and may be electrically connected to the gate lines 11, respectively. In an embodiment, a first contact plug CT1 may extend into the gate structure GST through an upper surface of the gate structure GST and may be electrically connected to a first gate line GL1.

The insulating spacers 17 may surround a sidewall of the contact plugs 13. The insulating spacers 17 may include an insulating material such as an oxide or a nitride. In an embodiment, a first insulating spacer SP1 may surround a sidewall of the first contact plug CT1, and remaining gate lines 11 except for the first gate line GL1 may be insulated from the first contact plug CT1 by the first insulating spacer SP1.

The conductive supports 14 may extend through the gate structure GST in the contact region CTR of the gate structure GST. The conductive supports 14 may be used as supports for supporting the stack during the manufacturing process. The conductive supports 14 may extend through the gate structure GST. The contact plugs 13 may be positioned between the conductive supports 14. In an embodiment, the conductive supports 14 may be positioned at vertices of a polygon, and the contact plug 13 may be positioned at a center of the polygon. The conductive supports 14 may pass through the gate structure GST, and may be perpendicular to the gate lines 11 and the insulation layers 12 which extend in a lateral or horizontal direction. The conductive supports 14 may include a conductive material such as titanium nitride (TiN), tungsten (W), or molybdenum (Mo). In the embodiment of FIG. 1B, as an example, it is illustrated that each of the contact plugs 13 is positioned between six conductive supports positioned at the vertices of a hexagon.

Each of the gate lines 11 may include a line portion 11L and an extension portion 11E. The line portion 11L may extend along a first direction I. The line portion 11L may surround a sidewall of the channel structure CH in the cell region CR and may extend to the contact region CTR. The extension portion 11E may be positioned in the contact region CTR. The extension portion 11E may be positioned between the conductive supports 14 and the contact plug 13, and may electrically connect the contact plug 13 and at least one conductive support 14.

In an embodiment, the first gate line GL1 may include the line portion 11L and the extension portion 11E. The line portion 11L may surround the sidewall of the channel structure CH, and the extension portion 11E may surround a sidewall of the first contact plug CT1. A lower sidewall of the first contact plug CT1 may be exposed by the insulating spacer 17, and the extension portion 11E may surround the exposed lower sidewall of the first contact plug CT1. A portion of the first gate line GL1 surrounding the lower sidewall of the contact plug 13 may be the extension portion 11E. The extension portion 11E may be in contact with the first contact plug CT1 and the first conductive support CS1, and may electrically connect the first contact plug CT1 and the first conductive support CS1. The extension portion 11E may have a ring shape, and a central axis of the first contact plug CT1 and a central axis of the extension 11E may be positioned at the same point.

The first contact plug CT1 and at least one first conductive support CS1 may be electrically connected through the extension portion 11E, and the first conductive support CS1 may provide an electrical connection path between the first contact plug CT1 and a peripheral circuit. In an embodiment, a case where the first contact plug CT1 is connected to four first conductive supports CS1 is shown, but an arrangement shape of the first conductive supports CS1 and the number of connected first conductive supports CS1 may be variously changed.

The insulating barrier 15 may entirely surround a sidewall of the conductive support 14. The insulating barriers 15 may be positioned between the conductive support 14 and the gate lines 11, respectively. In an embodiment, the insulating barriers 15 may be positioned between the remaining gate lines 11 except for the first gate line GL1 and the conductive support 14. The remaining gate lines 11 except for the first gate line GL1 and the conductive support 14 may be insulated from each other by the insulating barriers 15. The insulating barrier 15 may have a ring shape.

The dummy insulating barrier 16 may partially surround the sidewall of the conductive support 14. The dummy insulating barrier 16 may be positioned between the conductive support 14 and the gate line 11. In an embodiment, the dummy insulating barrier 16 may be partially positioned between the first gate line GL1 and the conductive support 14. The dummy insulating barrier 16 may have a C shape in a plane and may have a cut region that partially exposes the sidewall of the conductive support 14. The extension portion 11E may be in contact with the conductive support 14 through the cut region, and the first gate line GL1 and the conductive support 14 may be electrically connected to each other.

The insulating barrier 15 and the dummy insulating barrier 16 may include a material having an etch selectivity with respect to nitride. The insulating barrier 15 and the dummy insulating barrier 16 may include a material that may be selectively deposited on a surface of nitride. In an embodiment, the insulating barrier 15 and the dummy insulating barrier 16 may include a material having an etch selectivity with respect to silicon nitride, and may include silicon oxycarbide (SiOC), silicon oxide (SiOx) such as silicon dioxide ($SiO_2$), or the like. Here, x may be an integer.

The insulating barrier 15 and the dummy insulating barrier 16 may include a material having a dielectric constant lower than that of silicon oxide. The dielectric constant of silicon oxide is about 4.0, and the dielectric constant of SiOC is 2.5 to 3.9. By forming the insulating barrier 15 and the dummy insulating barrier 16 with SiOC having a relatively low dielectric constant, a capacitance between the gate line 11 and the contact plug 13 may be reduced.

The insulating liners 18 may surround the sidewall of the conductive support 14 between the insulating barriers 15. The insulating liners 18 may be positioned between the conductive support 14 and the insulating layers 12. The insulating liners 18 may entirely surround the sidewall of the conductive support 14. In an embodiment, the insulating liners 18 may include oxide.

According to the above-described structure, the contact plugs 13 may extend to different depths inside the gate structure GST and may be electrically connected to different gate lines 11. Therefore, a bias may be applied to each of the stacked gate lines 11 without patterning the gate structure GST in a step shape. In addition, the contact plug 13 and the conductive support 14 may be electrically connected through the extension portion 11E. Therefore, the conductive support 14 may be used not only as a support during a manufacturing process, but also as a path through which a current and/or a voltage flows when driving a memory cell.

Figure 2A:
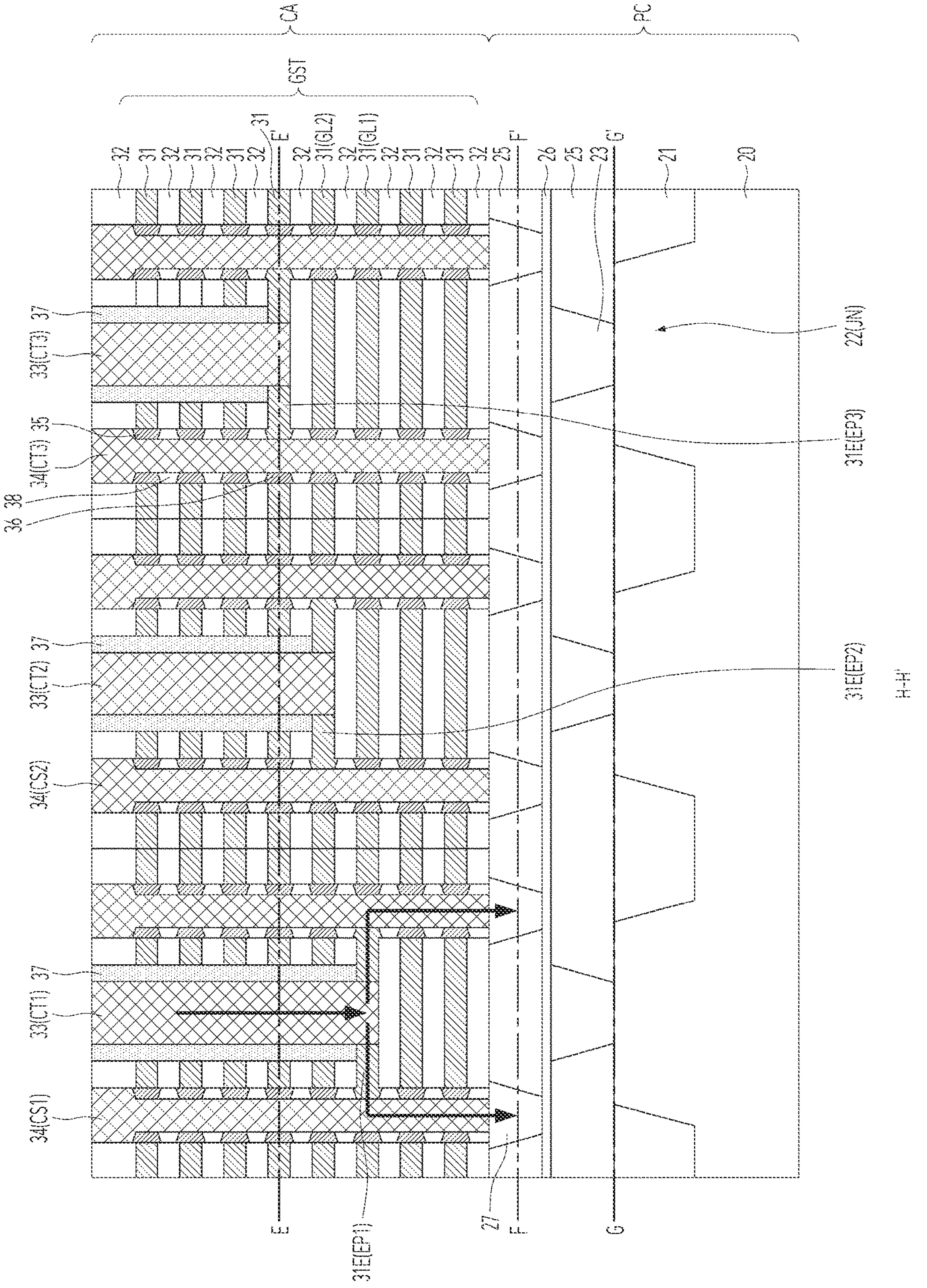
FIGS. 2A to 2D are diagrams illustrating a structure of a semiconductor device according to an embodiment of the present disclosure.
Figure 2B:
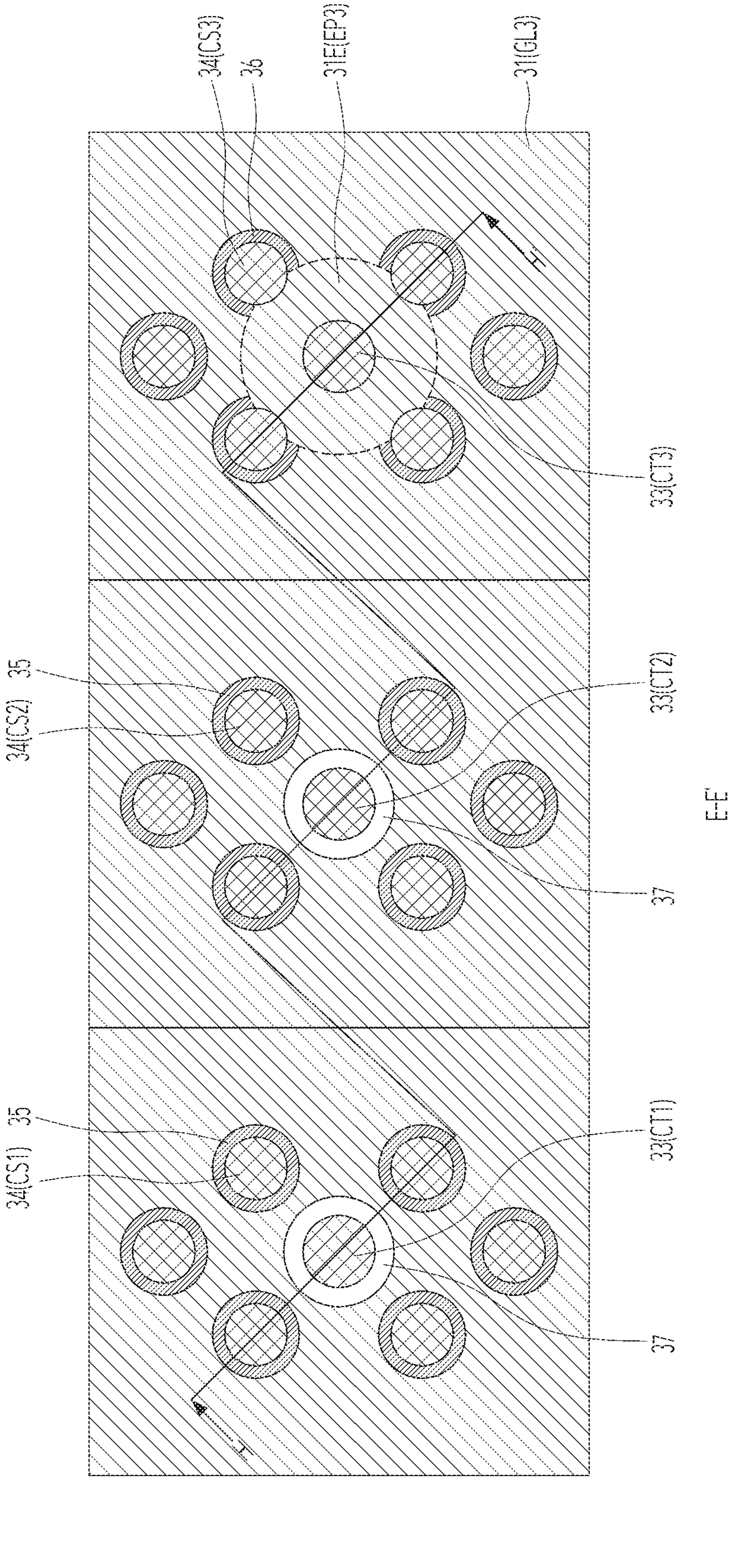
Figure 2C:
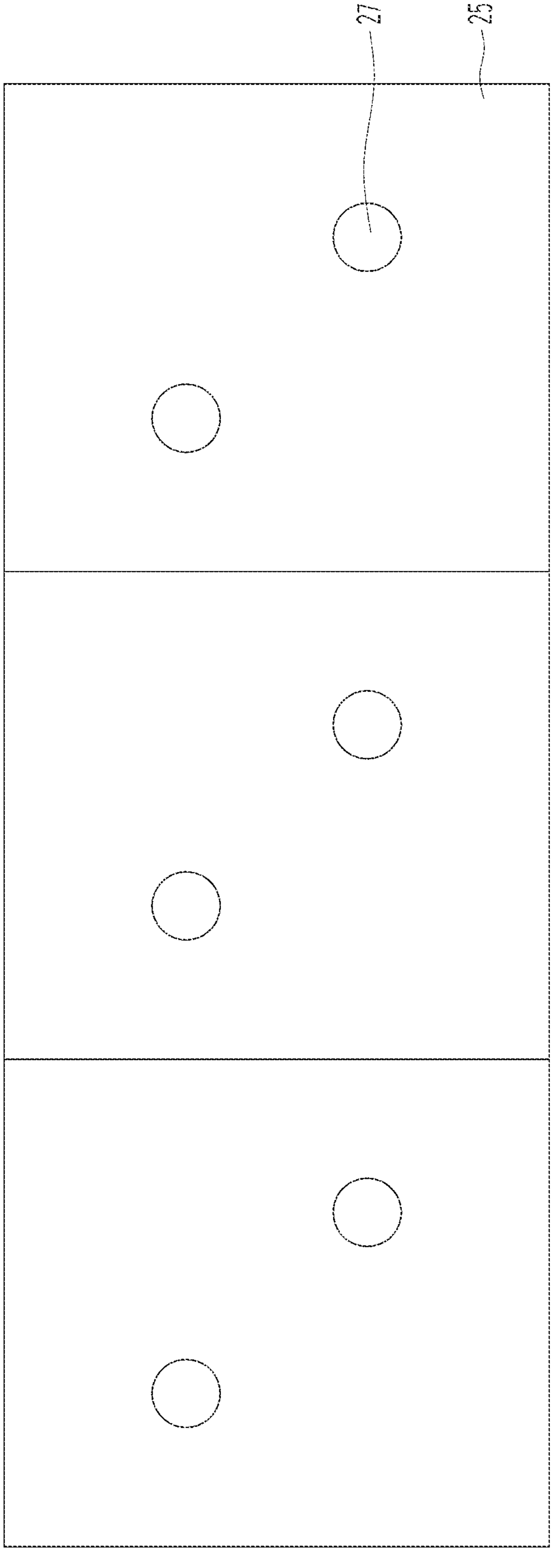
Figure 2D:
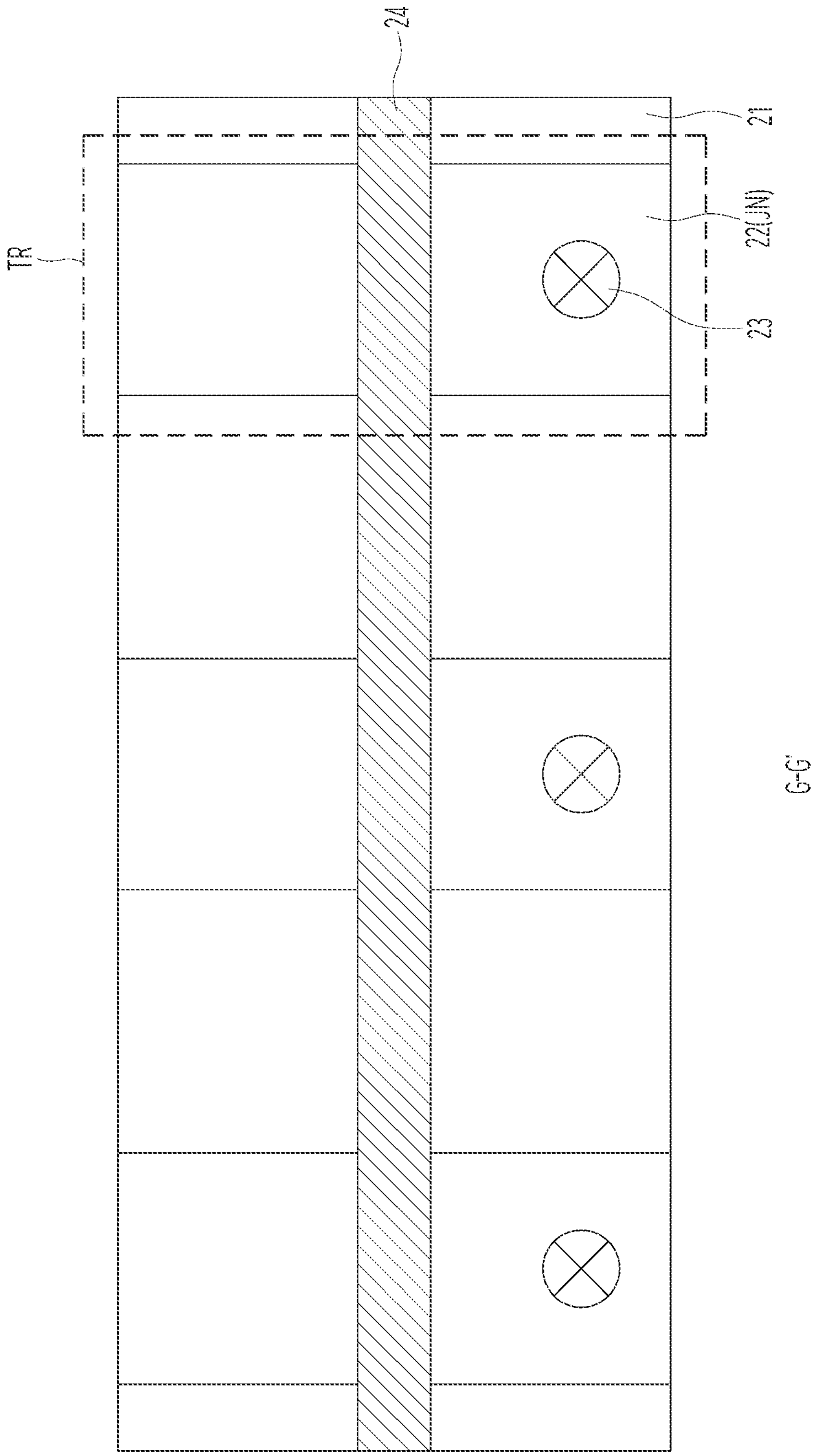
Figure 3:
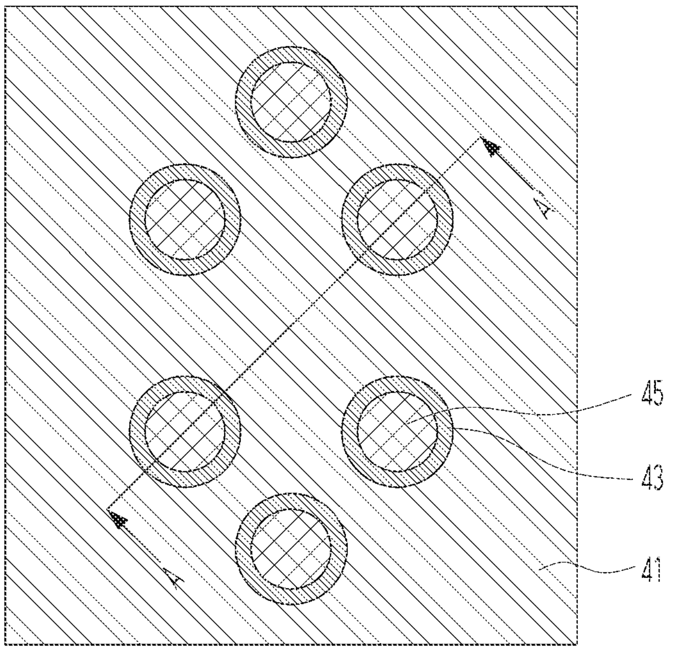
FIGS. 3, 4A to 4C, 5, 6A to 6C, 7, 8A, and 8B are diagrams illustrating a method of manufacturing a semiconductor device according to an embodiment of the present disclosure.

FIGS. 2A to 2D are diagrams illustrating a structure of a semiconductor device according to an embodiment of the present disclosure. FIG. 2A is a cross-sectional view taken along H-H' of FIG. 2B, FIG. 2B is a plan view taken along E-E' of FIG. 2A, FIG. 2C is a plan view taken along F-F' of FIG. 2A, and FIG. 2D is a plan view taken along G-G' of FIG. 2A. Hereinafter, a description overlapping a content described above may be omitted.

Referring to FIGS. 2A to 2D, the semiconductor device may include a memory cell array CA and a peripheral circuit PC. The memory cell array CA may include a gate structure GST, a contact plug 33, and a conductive support 34. The memory cell array CA may further include at least one of an insulating barrier 35, a dummy insulating barrier 36, an insulating spacer 37, and an insulating liner 38.

The gate structure GST may include gate lines 31 and insulating layers 32 that are alternately stacked. The contact plugs 33 may extend inside the gate structure GST to different depths and may be connected to gate lines 31, respectively. The conductive supports 34 may be electrically connected to the contact plugs 33 through an extension portion 31E. The insulating spacer 37 may surround a sidewall of the contact plug 33. The insulating barriers 35 may be positioned between the conductive supports 34 and the gate lines 31 and may surround sidewalls of the conductive supports 34. The insulating liners 38 may be positioned between the conductive supports 34 and the insulating layers 32 and may surround the sidewall of the conductive supports 34. The dummy insulating barriers 36 may partially surround the sidewall of the conductive supports 34.

In an embodiment, first to third contact plugs CT1 to CT3 may extend into the gate structure GST in different depths. The first contact plug CT1 may be electrically connected to a first gate line GL1. The first contact plug CT1 and at least one first conductive support CS1 may be electrically connected to each other by a first extension portion EP1. The second contact plug CT2 may be electrically connected to a second gate line GL2. The second contact plug CT2 and at least one second conductive supporter CS2 may be electrically connected to each other by a second extension portion EP2. The third contact plug CT3 may be electrically connected to a third gate line GL3. The third contact plug CT3 and at least one third conductive support CS3 may be electrically connected to each other by a third extension portion EP3.

The peripheral circuit PC may include a page buffer, an X-decoder, and the like. An element isolation layer 21 may be positioned in a substrate 20, and an active region 22 may be defined by the element isolation layer 21. A gate line 24 may be positioned on the active region 22 and may extend in the first direction I. The active region 22 may extend in a second direction II crossing the first direction I. A transistor TR may be positioned in a region where the active region 22 and the gate line 24 intersect. The transistor TR may include a junction JN positioned in the active region 22. In an embodiment, the transistor TR may be a pass transistor that controls a connection of a global line and a local line.

The conductive supports 34 may be electrically connected to the peripheral circuit PC directly. The conductive supports 34 may be electrically connected to the peripheral circuit PC through an interconnection structure as illustrated in the embodiment of FIG. 2A, for example, with the interconnection structure including at least one of a first contact plug 23, a second contact plug 27, and a line 26. For example, the conductive supports 34 may be connected to corresponding second contact plugs 27, and the second contact plugs 27 may be connected to the first contact plugs 23 through the line 26. For example, the first contact plug 23 may be connected to the junction JN of the transistor TR. The second contact plug 27 may be a discharge contact plug for discharging a charge accumulated on the substrate or the like during a manufacturing process, and may be connected to the line 26 by passing through the substrate and/or an interlayer insulating layer. The second contact plugs 27 may be arranged to correspond to the conductive supports 34. In an embodiment, a shape in which two second contact plugs 27 are arranged diagonally is described, but the number and arrangement of the second contact plugs 27 may be variously changed.

According to the above-described structure, the memory cell array CA and the peripheral circuit PC may be electrically connected using the conductive supports 34. For example, a bias applied through the first contact plug CT1 may be transferred to the first conductive support CS1 through the first gate line GL1, and may be transferred to the peripheral circuit PC through the interconnection structures 25, 26, and 27. Or as another example, a bias applied through the second contact plug CT2 may be transferred to the second conductive support CS2 through the second gate line GL2, and may be transferred to the peripheral circuit PC through the interconnection structures 25, 26, and 27. A bias applied through the third contact plug CT3 may be transferred to the third conductive support CS3 through the third gate line GL3, and may be transferred to the peripheral circuit PC through the interconnection structures 25, 26, and 27. Therefore, a separate interconnection structure for connecting the memory cell array CA and the peripheral circuit PC might not be formed, and the memory cell array CA and the peripheral circuit PC may be connected using the conductive support 34.

Figure 4A:
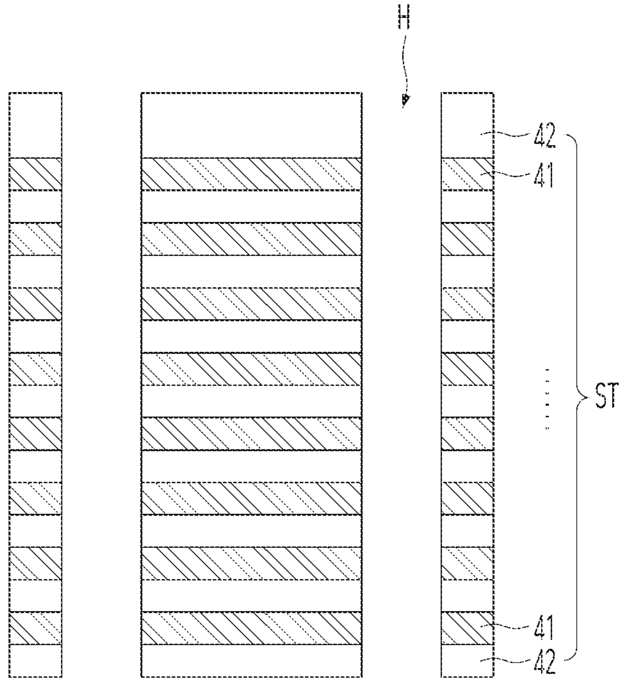
Figure 4B:
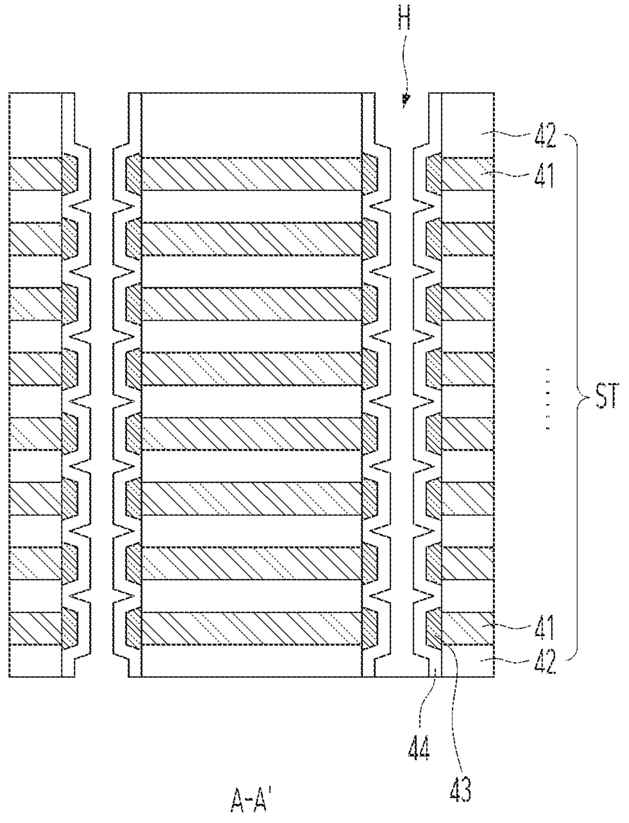
Figure 4C:
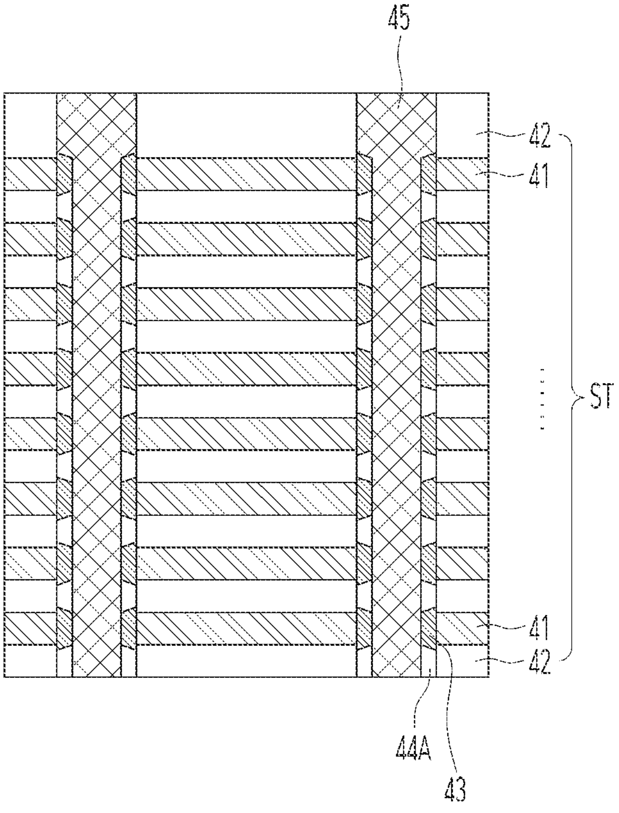
Figure 5:
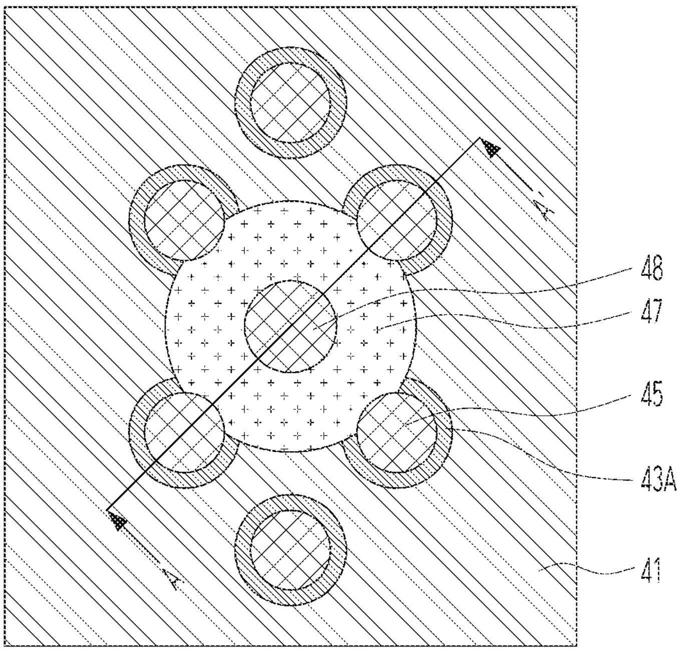
Figure 6A:
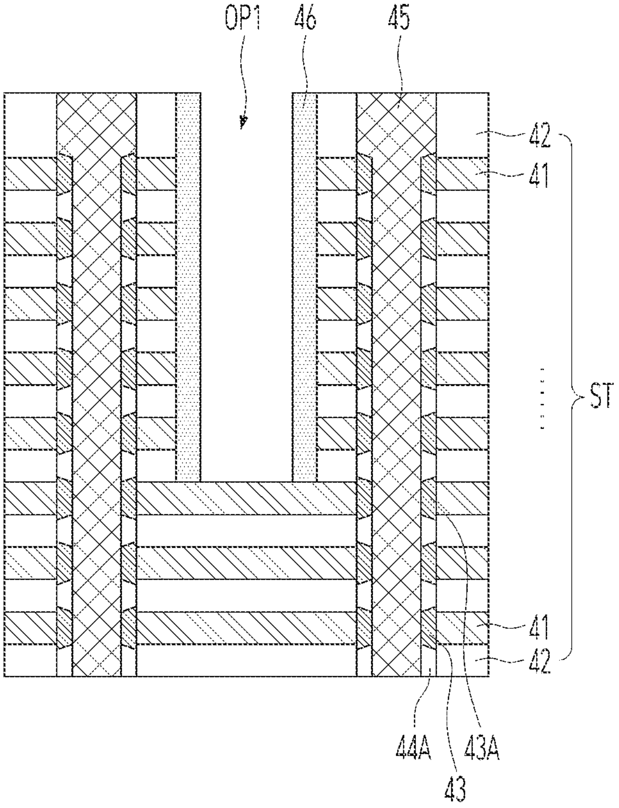
Figure 6B:
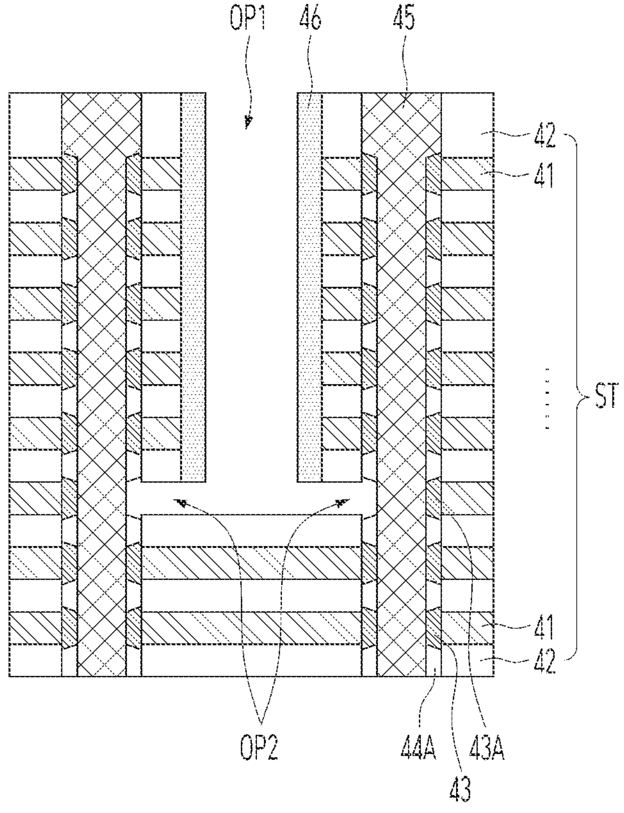
Figure 6C:
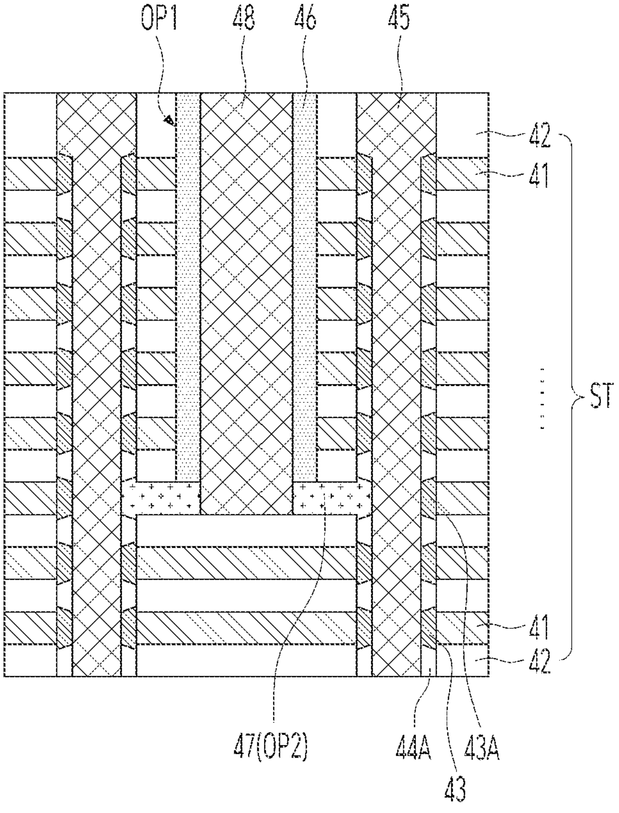
Figure 7:
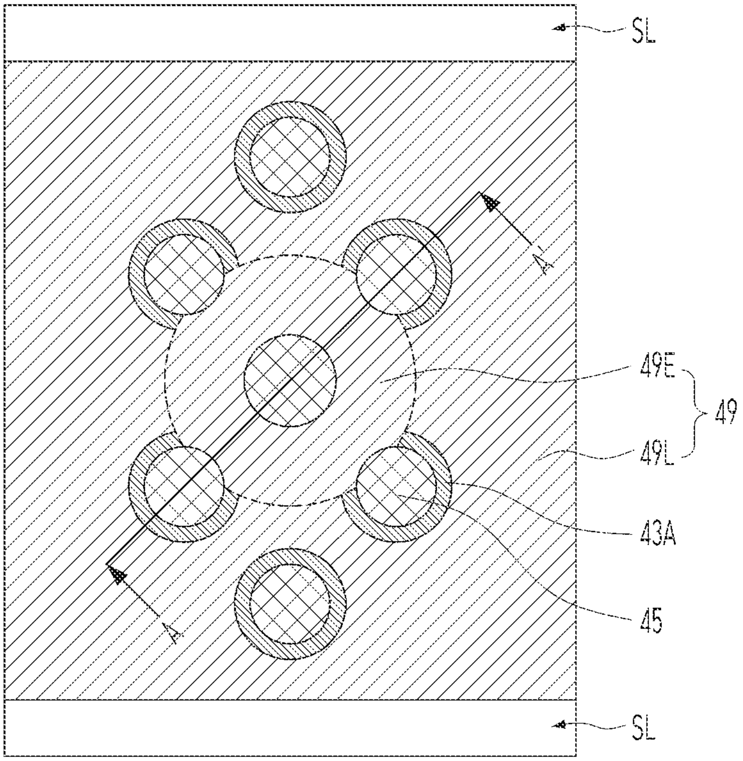
Figure 8A:
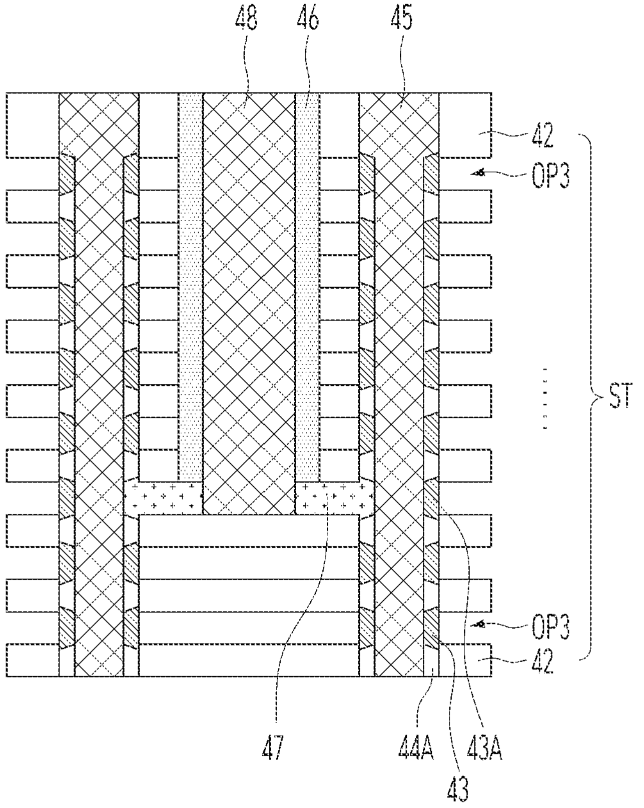
Figure 8B:
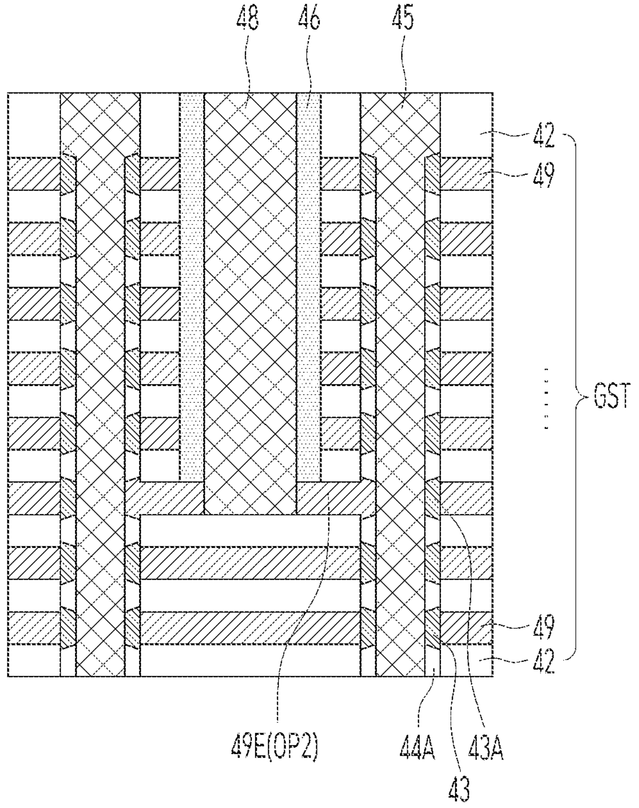

FIGS. 3, 4A to 4C, 5, 6A to 6C, 7, 8A, and 8B are simplified diagrams illustrating a method of manufacturing a semiconductor device according to an embodiment of the present disclosure. FIGS. 4A to 4C are cross-sectional views taken along A-A' of FIG. 3, FIGS. 6A to 6C are cross-sectional views taken along A-A' of FIG. 5, and FIGS. 8A and 8B are cross-sectional views taken along A-A' of FIG. 7.

Referring to FIGS. 3 and 4A to 4C, conductive supports 45 may be formed in a stack ST. First, referring to FIG. 4A, the stack ST including first material layers 41 and second material layers 42 alternately stacked may be formed. In an embodiment, the stack ST may be formed on a substrate including a lower structure such as a peripheral circuit and the like. In an embodiment, a first wafer including the stack ST and a second wafer including the peripheral circuit may be manufactured separately, and then, bonded together to form a semiconductor device.

The first material layers 41 may include a material having a high etch selectivity with respect to the second material layers 42. The first material layers 41 may be used for forming gate lines. The first material layers 41 may include a sacrificial material such as nitride, or a conductive material such as polysilicon, tungsten (W), or molybdenum (Mo). The second material layers 42 may be for insulating the stacked gate lines from each other. Therefore, the second material layers 42 may include an insulating material such as an oxide, or a nitride. In some embodiments, the second material layers 42 may be or include an air gap for insulating purposes. Subsequently, holes H may be formed to pass through an entire height of the stack ST. Hence, each of the holes H may extend in a vertical direction through the stack ST.

For reference, the stack ST and the holes H may be formed a plurality of times, for example, in a sequential manner. In an embodiment, a first stack may be formed first at a first time, and then, at a second time first holes extending through the first stack may be formed. Subsequently, first sacrificial layers may be formed in the first holes, and a second stack may be formed on the first stack. Subsequently, second holes extending through the second stack and connected to the first holes may be formed in the second stack. Subsequently, the first sacrificial layers may be removed through the second holes. Here, the first sacrificial layers may include carbon, titanium nitride, or the like.

Subsequently, referring to FIG. 4B, insulating barriers 43 may be formed. In an embodiment, the insulating barriers 43 may be formed through a selective deposition method. The insulating barriers 43 may be selectively deposited on a surface of the first material layers 41 among surfaces of the first material layers 41 and the second material layers 42 exposed through the holes H. The insulating barriers 43 may be selectively deposited only on the surfaces of the first material layers 41 that are exposed through the holes H and may not be deposited on the exposed surfaces of the second material layers 42. The insulating barrier 43 may include a material having an etch selectivity with respect to the first material layers 41. In an embodiment, the insulating barrier 43 may include silicon oxycarbide (“SiOC”). The insulating barrier 43 may have a ring shape. Subsequently, an insulating liner layer 44 may be formed. The insulating liner layer 44 may be deposited along an inner profile of the holes H in which the insulating barriers 43 are formed. The insulating liner layer 44 may be deposited to have a uniform thickness. Alternately, the insulating liner layer 44 may be deposited to have a relatively thicker thickness in the spaces between the insulating barriers 43 (i.e., over the exposed surfaces of the second material layers 42) than in the spaces over the insulating barriers 43. The insulating liner layer 44 inside the holes H may form a plurality of flat sections over the insulating barriers 43 alternating with V-shaped sections over the second material layers 42.

Subsequently, referring to FIG. 4C, the insulating liner layer 44 may be etched to form insulating liners 44A which are positioned only between the insulating barriers 43 and have a ring shape. Subsequently, the conductive supports 45 may be formed in the holes H. The conductive supports 45 may include a barrier layer and a metal gap-fill layer in the barrier layer. The barrier layer may include a metal nitride such as titanium nitride (TiN), and the metal gap-fill layer may include a metal such as tungsten (W) or molybdenum (Mo). The insulating barriers 43 and the insulating liners 44A may surround a sidewall of the conductive supports 45.

Referring to FIGS. 5 and 6A to 6C, a contact plug 48 may be formed in the stack ST. First, referring to FIG. 6A, a first opening OP1 may be formed between the conductive supports 45. In an embodiment, the first openings OP1 may be formed to have different depths and respectively expose corresponding first material layers 41. Subsequently, an insulating spacer 46 may be formed in the first opening OP1. The insulating spacer 46 may surround an inner wall of the first opening OP1 and expose the first material layer 41 on a lower surface of the first opening OP1.

Subsequently, referring to FIG. 6B, a second opening OP2 connected to the first opening OP1 may be formed below the first opening OP1. First, the first material layer 41 exposed through the lower surface of the first opening OP1 may be etched. The first material layer 41 may be selectively etched using the insulating spacer 46 as an etch barrier, and the first material layer 41 which is in a predetermined distance from the first opening OP1 may be etched. As the first material layer 41 is etched, a circular second opening OP2 may be formed, and as the second opening OP2 expands, the insulating barrier 43 may be exposed. At this time, the number of exposed insulating barriers 43 may be adjusted according to a range in which the second opening OP2 is expanded. The insulating barrier 43 positioned relatively close to the first opening OP1 may be exposed, and the insulating barrier 43 positioned relatively far from the first opening OP1 might not be exposed. Subsequently, the exposed insulating barrier 43 may be etched to expose the conductive support 45. The insulating barrier 43 may be selectively etched using the insulating spacer 46 as an etch barrier. Through this, the insulating barrier 43 may be partially etched, and a remaining portion may become a dummy insulating barrier 43A.

Subsequently, referring to FIG. 6C, a sacrificial pattern 47 may be formed in the second opening OP2. In an embodiment, the sacrificial pattern 47 may include a material having a high etch selectivity with respect to the dummy insulating barrier 43A. The dummy insulating barrier 43A may include silicon oxycarbide (“SiOC”), and the sacrificial pattern 47 may include silicon carbon-nitride (“SiCN”). In an embodiment, the sacrificial pattern 47 may include a material having an etch selectivity different from that of the first material layers 41. The first material layers 41 may include silicon nitride, and the sacrificial pattern 47 may include SiCN. In an embodiment, the sacrificial pattern 47 may include a material having an etch selectivity equal or similar to that of the first material layers 41. Both of the first material layers 41 and the sacrificial pattern 47 may include silicon nitride ($Si_3N_4$). The sacrificial pattern 47 may have a ring shape.

Subsequently, a contact plug 48 may be formed in the first opening OP1. The contact plug 48 may include a barrier layer and a gap-fill metal layer in the barrier layer. In an embodiment, the barrier layer may include a metal nitride such as TiN, and the gap-fill metal layer may include a metal such as tungsten (W) and molybdenum (Mo). A central axis of the contact plug 48 and a central axis of the sacrificial pattern 47 may be positioned at the same point.

Referring to FIGS. 7, 8A, and 8B, a conductive layer electrically connecting the contact plug 48 and the conductive support 45 may be formed. Here, the conductive layer may be a gate line 49 including an extension portion 49E.

First, referring to FIG. 8A, third openings OP3 may be formed by removing the first material layers 41. In an embodiment, a slit SL extending through the stack ST may be formed. The slit SL may have a depth exposing the first material layers 41. The third openings OP3 may be formed by selectively etching the first material layers 41 through the slit SL. The insulating barriers 43, the dummy insulating barrier 43A, and the sacrificial pattern 47 may be exposed through the third openings OP3. At this time, the second material layers 42 may remain between the third openings OP3, and the conductive supports 45 may support the remaining second material layers 42.

Subsequently, referring to FIG. 8B, the sacrificial pattern 47 may be removed through the third opening OP3. Through this, the second opening OP2 may be opened again and the contact plug 48 may be exposed. For reference, according to an etch selectivity of the first material layers 41 and the sacrificial pattern 47, a method of etching the first material layers 41 and the sacrificial pattern 47 may be changed. In an embodiment, the sacrificial pattern 47 may have an etch selectivity with respect to the first material layers 41, and the sacrificial pattern 47 may be etched after the first material layers 41 are etched. When the sacrificial pattern 47 includes SiCN and the first material layers 41 include silicon nitride ($Si_3N_4$), the first material layers 41 and the sacrificial pattern 47 may be sequentially etched. In an embodiment, the sacrificial pattern 47 and the first material layers 41 may include the same material, and the first material layers 41 and the sacrificial pattern 47 may be etched simultaneously. When both of the first material layers 41 and the sacrificial pattern 47 include silicon nitride ($Si_3N_4$), the first material layers 41 and the sacrificial pattern 47 may be etched simultaneously.

Subsequently, gate lines 49 may be formed in the second opening OP2 and the third openings OP3. The gate line 49 may include the extension portion 49E formed in the second opening OP2 and a line portion 49L formed in the third opening OP3. The extension portion 49E may electrically connect the contact plug 48 and the conductive support 45. The gate line 49 may include a barrier layer and a gap-fill metal layer in the barrier layer. In an embodiment, the barrier layer may include a metal nitride such as (TiN), and the gap-fill metal layer may include a metal such as tungsten (W) and molybdenum (Mo).

According to the above-described manufacturing method, the gate lines 49 including the extension portion 49E may be formed. The contact plug 48 and the conductive support 45 may be electrically connected to each other through the extension portion 49E and a current path between the contact plug 48 and the peripheral circuit may be provided.

Figure 9:
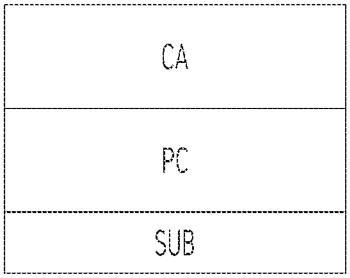
FIG. 9 is a configuration diagram of a semiconductor device according to an embodiment of the present disclosure.
Figure 10:
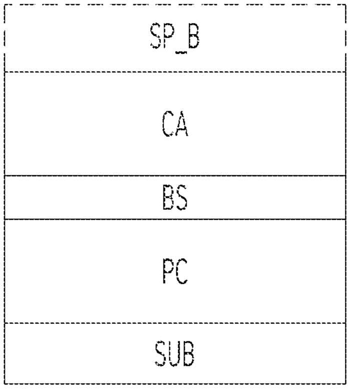
FIG. 10 is a configuration diagram of a semiconductor device according to an embodiment of the present disclosure.

The structure and the manufacturing method according to the above-described embodiments may be applied to semiconductor devices of various structures. FIGS. 9 and 10 illustrate a schematic configuration of a semiconductor device to which the above-described embodiments are applicable.

FIG. 9 is a configuration diagram of a semiconductor device according to an embodiment of the present disclosure.

Referring to FIG. 9, the semiconductor device may include a substrate SUB, a peripheral circuit PC, and a memory cell array CA. Here, the peripheral circuit PC and the memory cell array CA may be formed on the same substrate.

The substrate SUB may be made of or include a semiconductor material. In an embodiment, the semiconductor material may include at least one of a group IV semiconductor, a group III-V compound semiconductor, and a group II-VI compound semiconductor. Here, the group IV semiconductor may include single crystal silicon (Si), polycrystalline silicon, germanium (Ge), or silicon germanium (SiGe). The group III-V compound semiconductor may include GaAs, GaN, GaP, GaAsP, GaInAsP, AlAs, AlGa, InP, InSb, or InGaAs. The group II-VI compound semiconductor may include ZnS, ZnO, or CdS.

The substrate SUB may include a dielectric layer. The substrate SUB may be a silicon-on-insulator (SOI) substrate, a germanium-on-insulator (GeOI) substrate, or a glass substrate. The substrate SUB may include an organic material. In an embodiment, the substrate SUB may include graphene.

The substrate SUB may be a bulk wafer or an epitaxial layer grown in a selective epitaxial growth (SEG) method. The substrate SUB may be a layer formed in a metal induced lateral crystallization (MILC) method and may partially include metal. The substrate SUB may have a single crystalline, polycrystalline, or amorphous state. The substrate SUB may include an impurity of group II, group III, group IV, group V, or group VI. In an embodiment, the substrate SUB may include an n-well region doped with an n-type impurity and/or a p-well region doped with a p-type impurity.

The peripheral circuit PC may be disposed between the substrate SUB and the memory cell array CA. The peripheral circuit PC may include a row decoder, a column decoder, a page buffer, a logic circuit, a control circuit, a sense amplifier, an input/output circuit, and the like. In an embodiment, the peripheral circuit PC may include an NMOS transistor, a PMOS transistor, a resistor, a capacitor, and the like. The peripheral circuit PC may further include an interconnection structure. The interconnection structure may be used as a path for transferring an operation voltage, and may include a contact plug, a line, and the like.

The memory cell array CA may include memory cells. In an embodiment, the memory cell array CA may include memory strings connected between a source line and a bit line, and each memory string may include stacked memory cells. In an embodiment, the memory cell array CA may include memory cells connected between a word line and a bit line. The memory cell array CA may further include an interconnection structure.

FIG. 10 is a configuration diagram of a semiconductor device according to an embodiment of the present disclosure.

Referring to FIG. 10, the semiconductor device may include a substrate SUB, a peripheral circuit PC, a bonding structure BS, and a memory cell array CA. Here, the peripheral circuit PC and the memory cell array CA may be respectively formed on separate substrates and then bonded. The semiconductor device may further include a support base SP_B.

The substrate SUB may be used as a support in a process of forming the peripheral circuit PC. The support base SP_B may be used as a support in a process of forming the memory cell array CA. In an embodiment, after respectively manufacturing a first wafer including the memory cell array CA and a second wafer including the peripheral circuit PC, the first wafer and the second wafer may be electrically connected by the bonding structure BS. After bonding, at least a portion of the support base SP_B of the first wafer may be removed. The support base SP_B may be completely removed or may partially remain on the memory cell array CA.

The support base SP_B may be a semiconductor substrate, an insulating substrate, a silicon-on-insulator (SOI) substrate, a germanium-on-insulator (GeOI) substrate, or the like. The support base SP_B may be a bulk wafer, an epitaxial layer grown in a selective epitaxial growth (SEG) method, or a layer formed in a metal induced lateral crystallization (MILC) method. The support base SP_B may have a single crystalline, polycrystalline, or amorphous state. The support base SP_B may include an impurity of group II, group III, group IV, group V, or group VI.

The bonding structure BS may be for connecting the memory cell array CA and the peripheral circuit PC. In an embodiment, the memory cell array CA and the peripheral circuit PC may be bonded in a wafer-on-wafer bonding method, a chip-on-wafer bonding method, a chip-on-chip bonding method, or the like. The bonding structure BS may include a bonding pad, a bonding layer, a bonding interface, and the like. The bonding pad may include a metal such as copper and aluminum, and/or an alloy. The bonding interface may include a non-metal-non-metal interface, a metal-metal interface, or the like. The memory cell array CA and the peripheral circuit PC may be electrically connected by the bonding structure BS.

For reference, an interconnection structure included in the memory cell array CA and/or the peripheral circuit PC may be directly connected without a bonding pad. In an embodiment, a bonding layer included in the memory cell array CA and a bonding layer included in the peripheral circuit PC may be bonded to form a bonding interface, and the interconnection structure included in the memory cell array CA and the interconnection structure included in the peripheral circuit PC may be directly connected. Through this, contact plugs, lines, and the like formed on different wafers may be electrically connected without a separate bonding pad.

Other configurations may be equal or similar to those described above with reference to FIG. 9.

The semiconductor device may have a structure in which the embodiments described above with reference to FIGS. 9 and 10 are combined or may have a partially modified structure. In the embodiment described with reference to FIGS. 9 and 10, positions of the memory cell array CA and the peripheral circuit PC may be changed. At least one memory cell array CA and/or at least one peripheral circuit PC may be additionally bonded to the embodiment described with reference to FIG. 9. In an embodiment, a portion of the peripheral circuitry PC may be disposed in the memory cell array CA.

Although embodiments according to the technical concepts of the present disclosure have been described above with reference to the accompanying drawings, this is only for describing the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical concepts of the present disclosure defined in the following claims, and it should be construed that these substitutions, modifications, and changes belong to the scope of the present disclosure. Furthermore, the embodiments may be combined to form additional embodiments.

What is claimed is:

1. A semiconductor device comprising:

a gate structure including gate lines and insulation layers alternately stacked;

conductive supports extending perpendicularly or substantially perpendicularly through the gate structure; and contact plugs extending perpendicularly or substantially perpendicularly only partially inside the gate structure, each contact plug being positioned between adjacent conductive supports, and extending to a different depth within the gate structure to connect to a different gate line among the gate lines, wherein a first contact plug among the contact plugs is electrically connected to a first gate line among the gate lines, and the first contact plug is electrically connected to a first conductive support among the conductive supports through the first gate line.

2. The semiconductor device of claim 1, wherein the gate structure includes a cell region and a contact region, and wherein the conductive supports and the contact plugs are positioned in the contact region.

3. The semiconductor device of claim 2, further comprising:

a channel structure extending through the cell region of the gate structure.

4. The semiconductor device of claim 3, wherein the first gate line comprises:

a line portion surrounding a sidewall of the channel structure and extending into the contact region; and an extension portion surrounding a sidewall of the first contact plug and connecting the first conductive support and the first contact plug.

5. The semiconductor device of claim 1, further comprising:

insulating barriers entirely surrounding a sidewall of the first conductive support and positioned between the first conductive support and remaining gate lines other than the first gate line.

6. The semiconductor device of claim 5, wherein the insulating barriers have a ring shape and insulate the first conductive support and the remaining gate lines from each other.

7. The semiconductor device of claim 5, wherein the insulating barriers include SiCN.

8. The semiconductor device of claim 5, further comprising:

insulating liners surrounding a sidewall of the first conductive support between the insulating barriers.

9. The semiconductor device of claim 1, further comprising:

a dummy insulating barrier partially surrounding a sidewall of the first conductive support so that the first conductive support and the first gate line are electrically connected.

10. The semiconductor device of claim 9, wherein the dummy insulating barrier has a C shape in a plane.

11. The semiconductor device of claim 1, further comprising:

an insulating spacer surrounding a sidewall of the first contact plug.

12. The semiconductor device of claim 1, further comprising:

a peripheral circuit positioned under the gate structure and electrically connected to the first conductive support.

13. A semiconductor device comprising:

a peripheral circuit;

a gate structure positioned on the peripheral circuit and including stacked gate lines;

a contact plug extending through the gate structure and electrically connected to a first gate line among the gate lines;

a conductive support extending through the gate structure and electrically connected to the peripheral circuit;

insulating barriers entirely surrounding a sidewall of the conductive support to insulate the conductive support from remaining gate lines other than the first gate line among the gate lines; and a dummy insulating barrier partially surrounding the sidewall of the conductive support so that the conductive support and the first gate line are electrically connected.

14. The semiconductor device of claim 13, wherein the gate structure includes a cell region and a contact region, and the conductive support and the contact plug are positioned in the contact region.

15. The semiconductor device of claim 14, further comprising:

a channel structure extending through the cell region of the gate structure.

16. The semiconductor device of claim 15, wherein the first gate line comprises:

a line portion surrounding a sidewall of the channel structure and extending into the contact region; and an extension portion surrounding a sidewall of the contact plug and connecting the conductive support and the contact plug.

17. The semiconductor device of claim 13, further comprising:

an insulating spacer surrounding a sidewall of the contact plug.

18. The semiconductor device of claim 13, further comprising:

insulating liners surrounding the sidewall of the conductive support between the insulating barriers.

19. The semiconductor device of claim 13, wherein the peripheral circuit includes a pass transistor, and the conductive support is connected to a junction of the pass transistor.

* * * * *